(12) United States Patent
Choi

(10) Patent No.: US 9,036,403 B2
(45) Date of Patent: May 19, 2015

(54) SEMICONDUCTOR MEMORY DEVICES

(71) Applicant: SK hynix Inc., Icheon-si (KR)

(72) Inventor: Hong Sok Choi, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 205 days.

(21) Appl. No.: 13/718,967

(22) Filed: Dec. 18, 2012

(65) Prior Publication Data

US 2014/0050016 A1 Feb. 20, 2014

(30) Foreign Application Priority Data

Aug. 20, 2012 (KR) .......................... 10-2012-0090937

(51) Int. Cl.
*G11C 11/24* (2006.01)
*G11C 5/14* (2006.01)
(52) U.S. Cl.
CPC . *G11C 5/14* (2013.01); *G11C 5/148* (2013.01)
(58) Field of Classification Search
CPC .................................. G11C 5/14; G11C 5/145
USPC .......................................... 365/149; 327/536
See application file for complete search history.

(56) References Cited

U.S. PATENT DOCUMENTS

| 5,305,270 | A | * | 4/1994 | Kim | ............................... 365/203 |
| 5,969,998 | A | * | 10/1999 | Oowaki et al. | ........... 365/189.09 |
| 2008/0018381 | A1 | * | 1/2008 | Shin | ............................... 327/536 |

FOREIGN PATENT DOCUMENTS

KR 10-0570425 4/2006
KR 1020110045395 A 5/2011

* cited by examiner

*Primary Examiner* — J. H. Hur
*Assistant Examiner* — Xiaochun L Chen
(74) *Attorney, Agent, or Firm* — Kilpatrick Townsend & Stockton LLP

(57) ABSTRACT

The semiconductor memory device includes a cell capacitor having a first terminal electrically connected to a storage node and a second terminal electrically connected to an internal node, an internal voltage generator configured to generate an internal voltage signal applied to the internal node in response to a power-up signal, and an initialization element configured to initialize the internal node in response to the power-up signal.

14 Claims, 4 Drawing Sheets

SEMICONDUCTOR MEMORY DEVICES

CROSS-REFERENCE TO RELATED APPLICATION

The present application claims priority under 35 U.S.C. 119(a) to Korean Application No. 10-2012-0090937, filed on Aug. 20, 2012, in the Korean Intellectual Property Office, which is incorporated herein by reference in its entirety as set forth in full.

BACKGROUND

In computer systems including integrated circuits, booting is performed to bring up and run operating systems that control the execution of computer programs and provide various services. The boot operation may be categorized as either a cold boot or a warm boot depending on a power condition. For example, for a cold boot, the operating system may be restarted by turning the power on from a power off condition, whereas for a warm boot, the operating system may be restarted without turning the power off.

Semiconductor memory devices may include various circuits, for example, a power-up signal generator that is used to assist with the powering up of the semiconductor memory device. The semiconductor memory device may be operated by an external power supply, and a voltage level of the external power supply may rise from a ground voltage to a target voltage with a certain slew rate. In some cases when the external power supply voltage is directly applied to the circuits of the semiconductor memory device, the semiconductor memory device may malfunction due to a fluctuation of the voltage level outputted from the external power supply. Thus, in order to prevent malfunction of the semiconductor memory device, a power-up signal from a power-up signal generator can be used to apply a stable power supply voltage to the circuits of the semiconductor memory device.

SUMMARY

Example embodiments are directed to semiconductor memory devices.

According to some embodiments, a semiconductor memory device includes a cell capacitor having a first terminal electrically connected to a storage node and a second terminal electrically connected to an internal node, an internal voltage generator configured to generate an internal voltage signal applied to the internal node in response to a power-up signal, and an initialization element electrically connected to the internal node and configured to initialize the internal node in response to the power-up signal.

According to further embodiments, a semiconductor memory device includes a cell capacitor having a first terminal electrically connected to a storage node and a second terminal electrically connected to a first internal node, a first internal voltage generator configured to generate a first internal voltage signal applied to the first internal node in response to a power-up signal, a second internal voltage generator configured to generate a second internal voltage signal applied to a second internal node in response to the power-up signal, and an initialization element electrically connected to the first internal node and configured to initialize the first internal node in response to the power-up signal. The initialization of the first internal node is performed by equalizing voltage levels of the first and second internal nodes.

BRIEF DESCRIPTION OF THE DRAWINGS

Embodiments of the inventive concept will become more apparent in view of the attached drawings and accompanying detailed description, in which.

DETAILED DESCRIPTION OF THE EMBODIMENTS

Example embodiments of the inventive concept will be described more fully hereinafter with reference to the accompanying drawings. However, the example embodiments described herein are for illustrative purposes only and are not intended to limit the scope of the inventive concept.

Figure 1:
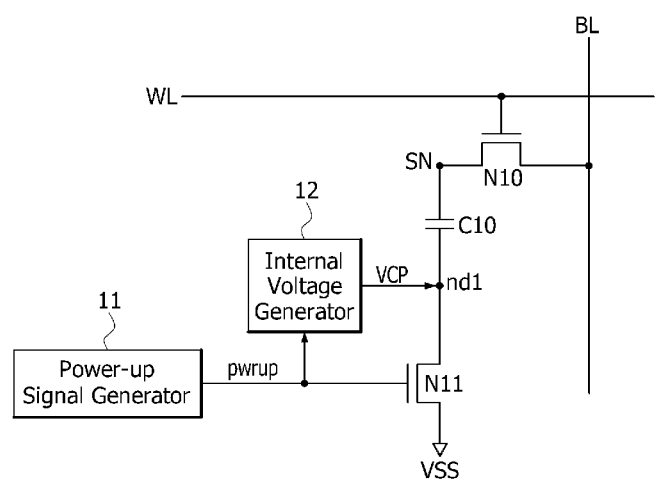
FIG. 1 is a block diagram illustrating a configuration of a semiconductor memory device according to some embodiments.

FIG. 1 is a block diagram illustrating a configuration of a semiconductor memory device according to some embodiments.

As illustrated in FIG. 1, a semiconductor memory device according to an example embodiment may be configured to include a cell transistor N10, a cell capacitor C10, a power-up signal generator 11, an internal voltage generator 12 and an initialization element N11. In some embodiments, the initialization element N11 can be a transistor as shown. In other embodiments, any suitable circuit for performing the initialization function as described herein can be used. The cell transistor N10 may be turned on to create a current path between a bit line BL and a storage node SN when a word line WL is activated. That is, the cell transistor N10 may electrically connect the bit line BL to the storage node SN when the word line WL is activated. The cell capacitor C10 may be used to provide or store an electric charge at the storage node SN. When a power supply voltage signal VDD is applied to the power-up signal generator 11, the power-up signal generator 11 may generate a power-up signal PWRUP whose voltage level rises up pursuant to a rising edge of the power supply voltage signal VDD until the power supply voltage signal VDD reaches a predetermined level. When the power supply voltage signal VDD reaches the predetermined level, the power-up signal PWRUP may abruptly fall down to a logic "low" level. Further, when the power supply voltage signal VDD is interrupted or is being turned off, a voltage level of the power-up signal PWRUP outputted from the power-up signal generator 11 may abruptly rise up to a logic "high" level at a point of time when the power supply voltage signal VDD falls to the predetermined level. Thereafter, the power-up signal PWRUP may fall pursuant to a falling edge of the power supply voltage signal VDD. While the power-up signal PWRUP maintains a logic "low" level between the rising edge and the falling edge of the power supply voltage signal VDD, the internal voltage generator 12 may generate an internal voltage signal VCP which is applied to an internal node ND1 corresponding to a terminal of the cell capacitor C10 opposite to the storage node SN. That is, the cell capacitor C10 may have a first terminal electrically connected to the storage node SN and a second terminal electrically connected to the internal node ND1. The internal voltage signal VCP may be set to have a voltage level which is half or approximately half of a core voltage VCORE that is applied to a core region of the semiconductor memory device. In other embodiments, the internal voltage signal VCP may be set to other suitable voltage levels. The initialization element N11 may be turned on by the logic "high" level of the power-up signal PWRUP when the power supply voltage signal VDD is interrupted. This allows the internal node ND1 to be initialized to a ground voltage VSS when the power supply voltage signal VDD is interrupted.

Figure 2:
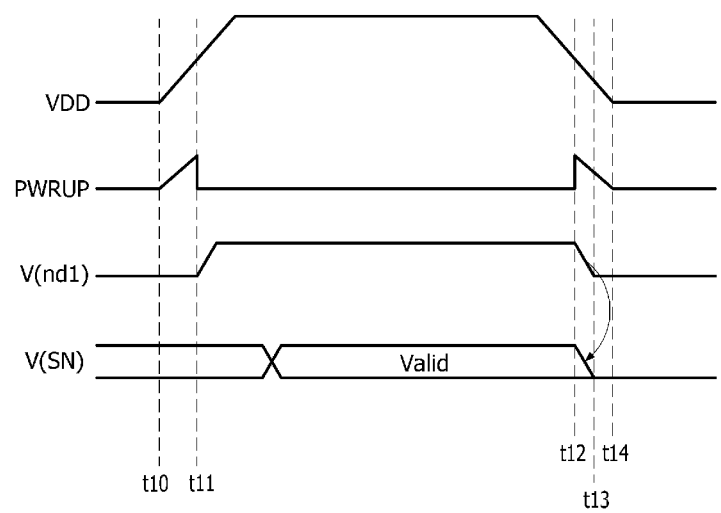
FIG. 2 is a timing diagram illustrating an operation of the semiconductor memory device shown in FIG. 1 according to some embodiments.

An operation of the semiconductor memory device illustrated in FIG. 1 will be described more fully hereinafter with reference to a timing diagram of FIG. 2.

First, a voltage level of the power-up signal PWRUP may rise up to a first level (e.g., a logic "high" level) pursuant to a rising edge of the power supply voltage signal VDD from a point of time t10 that the power supply voltage signal VDD is turned on until a point of time t11 when the power supply voltage signal VDD reaches a predetermined level (e.g., a predetermined level below the power supply voltage of the semiconductor memory device). The power-up signal PWRUP may then abruptly fall down to a second level (e.g., a logic "low" level) at the point of time t11. The internal voltage generator 12 may generate the internal voltage signal VCP at the point of time t11 when the voltage level of the power-up signal PWRUP abruptly falls down to a logic "low" level, and may supply the internal voltage signal VCP to the internal node ND1.

Next, if the power supply voltage signal VDD is interrupted or is being turned off, the voltage level of the power-up signal PWRUP may abruptly rise up to the first level (e.g., a logic "high" level) at a point of time t12 when the level of the power supply voltage signal VDD falls to the predetermined level. In some embodiments, the predetermined level at time t12 is the same voltage level as the predetermined level at time t11. In other embodiments, the predetermined level at time t12 can be a different voltage level than the predetermined level at time t11. From the point of time t12 that the voltage level of the power-up signal PWRUP abruptly rises up to the first level (e.g., a logic "high" level), the internal voltage generator 12 may terminate the generation of the internal voltage signal VCP and the initialization element N11 may initialize the internal node ND1 such that a voltage V(ND1) of the internal node ND1 is at a ground voltage VSS. In this manner, the internal node ND1 can be quickly initialized to a ground voltage VSS at a point of time t13 before a point of time t14 when the voltage level of the power supply voltage signal VDD reaches a logic "low" level after interruption of the power supply voltage signal VDD. The storage node SN may be initialized together with the internal node ND1 due to a coupling effect of the cell capacitor C10. Thus, a voltage V(SN) of the storage node SN can be reduced to a ground voltage VSS at the point of time t13. The voltage level of the power-up signal PWRUP may be gradually reduced to the second level (e.g., a logic "low" level) pursuant to the falling edge of the power supply voltage signal VDD during a period between the points of time t12 and t14.

As described above, according to some embodiments the storage node SN can be initialized together with the internal node ND1 when the voltage level of the power supply voltage signal VDD is interrupted. Thus, even though the storage node SN may retain an electric charge before the level of the power supply voltage signal VDD completely falls down to a ground voltage VSS, the storage node SN can still be initialized to a ground voltage VSS to prevent malfunction of the semiconductor memory device that can be caused by rapid toggling of the power supply between the on and off state. For example, even if the power source is turned on again to perform a cold boot just after turning the power source off, the malfunction that can be caused by erroneously performing a warm boot instead of the intended cold boot due to an electric charge being retained in the semiconductor memory device can be prevented because the storage node SN is initialized before the power source is turned on again.

Figure 3:
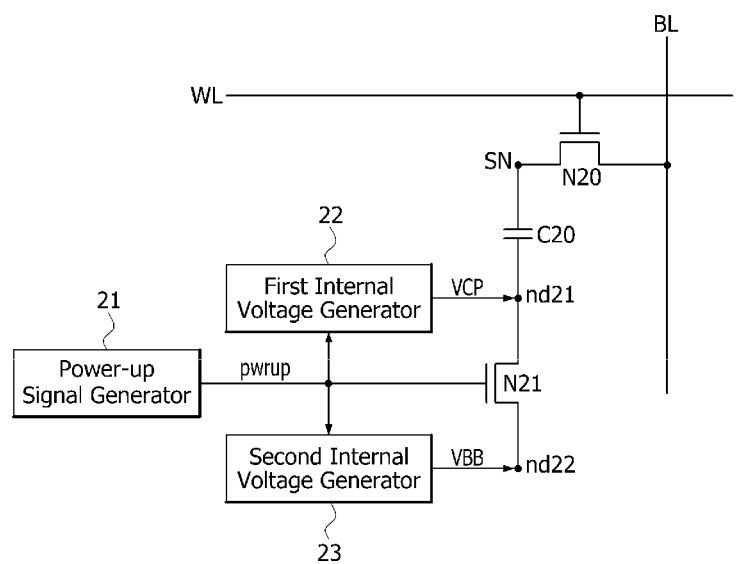
FIG. 3 is a block diagram illustrating a configuration of a semiconductor memory device according to further embodiments.

FIG. 3 is a block diagram illustrating a configuration of a semiconductor memory device according to further embodiments.

As illustrated in FIG. 3, a semiconductor memory device according to another example embodiment may be configured to include a cell transistor N20, a cell capacitor C20, a power-up signal generator 21, a first internal voltage generator 22, a second internal voltage generator 23, and an initialization element N21. In some embodiments, the initialization element N11 can be a transistor as shown. In other embodiments, any suitable circuit for performing the initialization function as described herein can be used. The cell transistor N20 may be turned on to create a current path between a bit line BL and a storage node SN when a word line WL is activated. That is, the cell transistor N20 may electrically connect the bit line BL to the storage node SN when the word line WL is activated. The cell capacitor C20 may be used to provide or store an electric charge at the storage node SN. When a power supply voltage signal VDD is applied to the power-up signal generator 21, the power-up signal generator 21 may generate a power-up signal PWRUP whose voltage level rises up pursuant to a rising edge of the power supply voltage signal VDD until the power supply voltage signal VDD reaches a predetermined level. When the power supply voltage signal VDD reaches the predetermined level, the power-up signal PWRUP may abruptly fall down to a logic "low" level. Further, when the power supply voltage signal VDD is interrupted or is being turned off, a voltage level of the power-up signal PWRUP outputted from the power-up signal generator 21 may abruptly rise up to a logic "high" level at a point of time when the power supply voltage signal VDD falls to the predetermined level. Thereafter, the power-up signal PWRUP may fall pursuant to a falling edge of the power supply voltage signal VDD. While the power-up signal PWRUP maintains a logic "low" level between the rising edge and the falling edge of the power supply voltage signal VDD, the first internal voltage generator 22 may generate a first internal voltage signal VCP which is applied to a first internal node ND21 corresponding to a terminal of the cell capacitor C20 opposite to the storage node SN. The first internal voltage signal VCP may be set to have a voltage level which is half or approximately half of a core voltage VCORE that is applied to a core region of the semiconductor memory device. In other embodiments, the internal voltage signal VCP may be set to other suitable voltage levels. While the power-up signal PWRUP maintains a logic "low" level between the rising edge and the falling edge of the power supply voltage signal VDD, the second internal voltage generator 23 may generate a second internal voltage signal VBB which is applied to a second internal node ND22 corresponding to a terminal of the initialization element N21 opposite to the first internal node ND21. The second internal voltage signal VBB may be used as a back bias voltage signal for adjusting a threshold voltage of MOS transistors in the semiconductor memory device and may be generated to have a negative voltage which is lower than a ground voltage. The initialization element N21 may be turned on by the logic "high" level of the power-up signal PWRUP when the power supply voltage signal VDD is interrupted. This allows the first internal node ND21 to be initialized to a voltage level of the second internal node ND22 when the power supply voltage signal VDD is interrupted.

Figure 4:
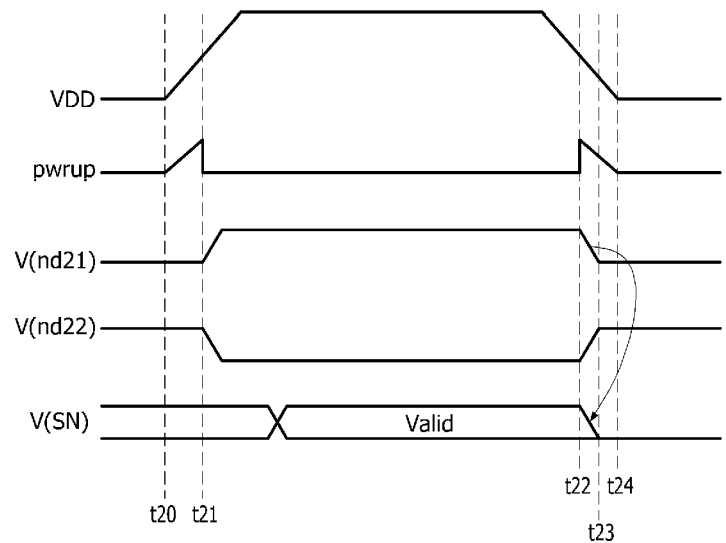
FIG. 4 is a timing diagram illustrating an operation of the semiconductor memory device shown in FIG. 3 according to further embodiments.

An operation of the semiconductor memory device illustrated in FIG. 3 will be described more fully hereinafter with reference to a timing diagram of FIG. 4.

First, a voltage level of the power-up signal PWRUP may rise up to a first level (e.g., a logic "high" level) pursuant to a rising edge of the power supply voltage signal VDD from a point of time t20 that the power supply voltage signal VDD is turned on until a point of time t21 that the power supply voltage signal VDD reaches a predetermined level (e.g., a predetermined level below the power supply voltage of the semiconductor memory device). The power-up signal PWRUP may then abruptly fall down to a second level (e.g., a logic "low" level) at the point of time t21. From the point of time t21 when the voltage level of the power-up signal PWRUP abruptly falls to the first level (e.g., a logic "low" level), the first internal voltage generator 22 may generate the first internal voltage signal VCP which is applied to the first internal node ND21 and the second internal voltage generator 23 may generate the second internal voltage signal VBB which is applied to the second internal node ND22.

Next, if the power supply voltage signal VDD is interrupted or is being turned off, the voltage level of the power-up signal PWRUP may abruptly rise up to the first level (e.g., a logic "high" level) at a point of time t22 when the level of the power supply voltage signal VDD falls to the predetermined level. In some embodiments, the predetermined level at time t22 is the same voltage level as the predetermined level at time t21. In other embodiments, the predetermined level at time t22 can be a different voltage level than the predetermined level at time t21. From the point of time t22, the first internal voltage generator 22 may terminate the generation of the first internal voltage signal VCP and the second internal voltage generator 23 may terminate the generation of the second internal voltage signal VBB. In addition, the initialization element N21 may initialize the first internal node ND21 such that a voltage V(ND21) of the first internal node ND21 is equalized with a voltage V(ND22) of the second internal node ND22. That is, the first and second nodes ND21 and ND22 may be electrically shorted to each other by the initialization element N21, which is turned on during a period between the points of time t22 and t24. In this manner, the first internal node ND21 can be quickly equalized with the second internal node ND22. As a result, the voltage V(ND21) of the first internal node ND21 may decrease to a certain voltage, for example, a ground voltage and the voltage V(ND22) of the second internal node ND22 may increase to the certain voltage. The storage node SN may be initialized together with the first internal node ND21 due to a coupling effect of the cell capacitor C20. Thus, a voltage V(SN) of the storage node SN can be initialized, for example, to a ground voltage VSS at a point of time t23 between the points of time t22 and t24. The voltage level of the power-up signal PWRUP may be gradually reduced to the second level (e.g., a logic "low" level) pursuant to the falling edge of the power supply voltage signal VDD during a period between the points of time t22 and t24.

As described above, according to some embodiments, the storage node SN can be initialized together with the first internal node ND21 when the voltage level of the power supply voltage signal VDD is interrupted or is being turned off. Thus, even though the storage node SN may retain an electric charge before the level of the power supply voltage signal VDD completely falls down to a ground voltage VSS, the storage node SN can still be initialized to a known voltage (e.g., a ground voltage) to prevent malfunction that can be caused by rapid toggling of the power supply between the on and off state. For example, even if the power source is turned on again to perform a cold boot just after turning the power source off, the malfunction that can be caused by erroneously performing a warm boot instead of the intended cold boot due to an electric charge being retained in the semiconductor memory device can be prevented because the storage node SN is initialized before the power source is turned on again.

The example embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A semiconductor memory device comprising:
a cell capacitor having a first terminal electrically connected to a storage node and a second terminal electrically connected to a first internal node;
a first internal voltage generator configured to generate a first internal voltage signal applied to the first internal node in response to a power-up signal;
a second internal voltage generator configured to generate a second internal voltage signal applied to a second internal node in response to the power-up signal; and
an initialization element electrically connected to the first internal node and configured to initialize the first internal node in response to the power-up signal,
wherein initialization of the first internal node is performed by equalizing voltage levels of the first and second internal nodes, and the second internal voltage signal has a negative voltage level which is lower than the level of a ground voltage.

2. The semiconductor memory device of claim 1, wherein during a power up operation to turn on a power supply voltage signal of the semiconductor device, a voltage level of the power-up signal rises during a rising edge of the power supply voltage signal until the power supply voltage signal reaches a predetermined level, and when the power supply voltage signal reaches the predetermined level, the power-up signal falls to a logic "low" level.

3. The semiconductor memory device of claim 2, wherein during the power up operation, the first internal voltage generator is configured to apply the first internal voltage to the first internal node after the voltage level of the power-up signal falls to the logic "low" level.

4. The semiconductor memory device of claim 3, wherein during the power up operation, the second internal voltage generator is configured to apply the second internal voltage to the second internal node after the voltage level of the power-up signal falls to the logic "low" level.

5. The semiconductor memory device of claim 1, wherein during a power down operation to turn off a power supply voltage signal of the semiconductor memory device, when the power supply voltage signal falls to a predetermined level, a voltage level of the power-up signal rises to a logic "high" level, and then falls during a falling edge of the power supply voltage signal.

6. The semiconductor memory device of claim 5, wherein during the power down operation, the first internal voltage generator is configured to terminate generation of the first internal voltage signal during a level transition period of the power-up signal.

7. The semiconductor memory device of claim 6, wherein during the power down operation, the second internal voltage generator is configured to terminate generation of the second internal voltage signal during the level transition period of the power-up signal.

8. The semiconductor memory device of claim 7, wherein during the power down operation, the initialization element initializes the first internal node during the level transition period of the power-up signal.

9. The semiconductor memory device of claim 8, wherein during the initialization of the first internal node, a voltage of the first internal node falls and a voltage of the second internal node rises to equalize the voltage of the first internal node with the voltage of the second internal node.

10. The semiconductor memory device of claim 1:
wherein when a power supply voltage signal of the semiconductor memory device is being turned on during a power up operation, a voltage level of the power-up signal rises to a first level during a rising edge of the power supply voltage signal, and then falls from the first level to a second level; and
wherein when the power supply voltage signal is being turned off during a power down operation, the voltage level of the power-up signal rises from the second level to the first level, and then falls from the first level to the second level during a falling edge of the power supply voltage signal.

11. The semiconductor memory device of claim 10:
wherein during the power up operation, the first internal voltage generator is configured to apply the first internal voltage signal to the first internal node in synchronization with a point of time when the voltage level of the power-up signal reaches the second level from the first level; and
wherein during the power down operation, the first internal voltage generator is configured to terminate generation of the first internal voltage signal in synchronization with a point of time when the voltage level of the power-up signal reaches the first level from the second level.

12. The semiconductor memory device of claim 11:
wherein during the power up operation, the second internal voltage generator is configured to apply the second internal voltage signal to the second internal node in synchronization with the point of time when the voltage level of the power-up signal reaches the second level from the first level; and
wherein during the power down operation, the second internal voltage generator is configured to terminate generation of the second internal voltage signal in synchronization with the point of time when the voltage level of the power-up signal reaches the first level from the second level.

13. The semiconductor memory device of claim 12, wherein during the power down operation, the initialization element is configured to initialize the first internal node in synchronization with the point of time when the voltage level of the power-up signal reaches the first level from the second level.

14. The semiconductor memory device of claim 13, wherein during the initialization of the first internal node, a voltage of the first internal node falls and a voltage of the second internal node rises to equalize the voltage of the first internal node with the voltage of the second internal node.

* * * * *